(12) United States Patent
Peake et al.

(10) Patent No.: US 8,901,638 B2
(45) Date of Patent: Dec. 2, 2014

(54) TRENCH-GATE SEMICONDUCTOR DEVICE

(75) Inventors: Steven Thomas Peake, Warrington (GB); Phil Rutter, Stockport (GB)

(73) Assignee: NXP B.V., Eindhoven (NL)

( * ) Notice: Subject to any disclaimer, the term of this patent is extended or adjusted under 35 U.S.C. 154(b) by 976 days.

(21) Appl. No.: 13/055,742

(22) PCT Filed: Jul. 27, 2009

(86) PCT No.: PCT/IB2009/053267
§ 371 (c)(1),
(2), (4) Date: Jan. 25, 2011

(87) PCT Pub. No.: WO2010/010543
PCT Pub. Date: Jan. 28, 2010

(65) Prior Publication Data
US 2011/0121384 A1    May 26, 2011

(30) Foreign Application Priority Data

Jul. 25, 2008 (EP) .................................. 08104885

(51) Int. Cl.
*H01L 29/66* (2006.01)
(52) U.S. Cl.
USPC .................................. 257/328; 257/E29.005
(58) Field of Classification Search
CPC ........................ H01L 29/407; H01L 29/4236
USPC ....................................................... 257/328
See application file for complete search history.

(56) References Cited

U.S. PATENT DOCUMENTS

| 5,998,833 A | 12/1999 | Baliga | |
|---|---|---|---|
| 2002/0153558 A1 | 10/2002 | Takemori et al. | |
| 2003/0089946 A1 | 5/2003 | Hshieh et al. | |
| 2005/0145934 A1 | 7/2005 | Kocon et al. | |
| 2005/0218447 A1 * | 10/2005 | Darwish | 257/330 |
| 2007/0037327 A1 * | 2/2007 | Herrick et al. | 438/151 |
| 2007/0290257 A1 * | 12/2007 | Kraft et al. | 257/330 |

FOREIGN PATENT DOCUMENTS

| EP | 0 717 450 A2 | 6/1996 |
|---|---|---|
| WO | WO 2005053031 A2 * | 6/2005 |
| WO | 2008/086348 A2 | 7/2008 |

* cited by examiner

*Primary Examiner* — Eva Yan Montalvo

(57) ABSTRACT

A trench-gate semiconductor device is disclosed, in which the player (10,6) which forms the body region (in a n-channel device) extends adjacent the trench (4) deeper into the device, to lie adjacent a lower trench electrode (3b, 3c). Since the p-layer extension (6) forms part of the channel, it must be very low doped, in order not to increase unduly the channel resistance in the on-state. The replacement of some of the out-diffusion resistance in the drift region by the (smaller) channel resistance results in a lower over-all Rdson. In the off-state, the p-layer forms, together with the underlying n-drift layer, a non-abrupt function, so that the depletion region in the off-state extends closer to the top surface (2) than for a conventional RSO trench-MOS, being split between the p- and n-layers, rather than all being in the n-drift region. The invention does not require a RESURF device structure, so has wide process windows, since the dopant levels and layer thicknesses do not have to be controlled to provide charge balancing.

11 Claims, 6 Drawing Sheets

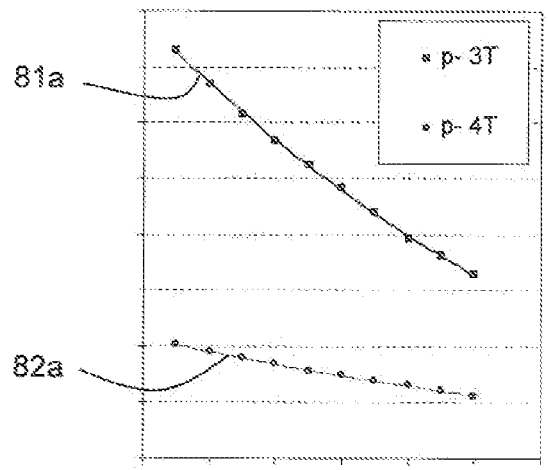
Fig 8(a)
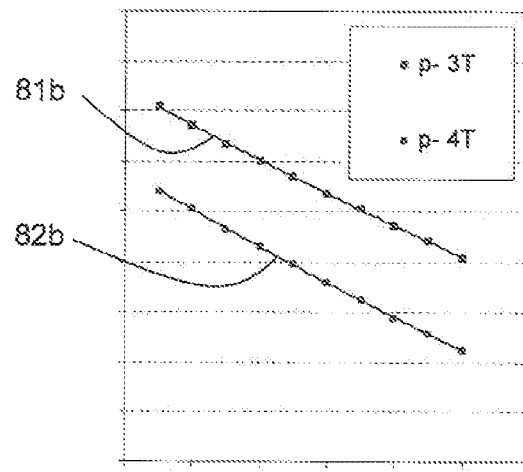
Fig. 8(b)
Fig. 8

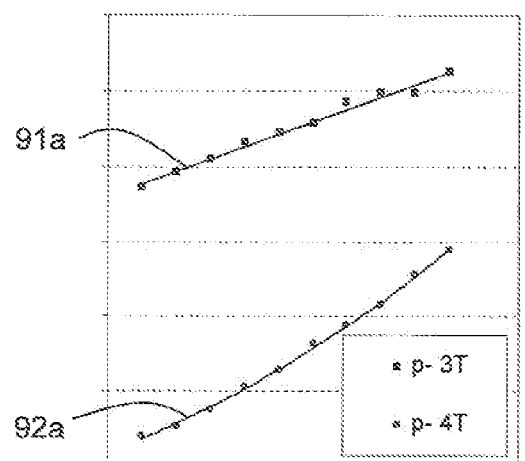
*Fig. 9(a)*
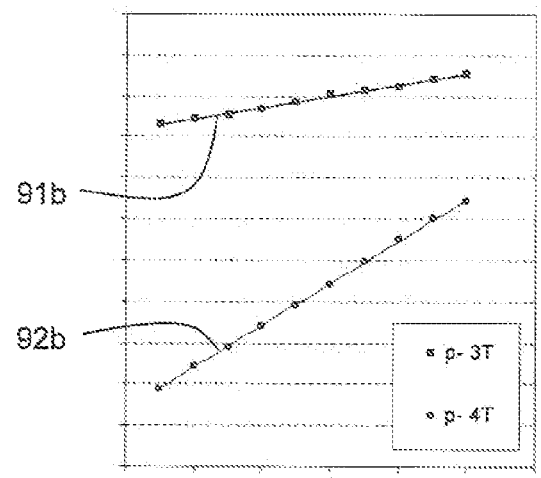
*Fig. 9(b)*
Fig. 9

TRENCH-GATE SEMICONDUCTOR DEVICE

FIELD OF THE INVENTION

This invention relates to semiconductor devices and in particular to trench-gate semiconductor devices, in which a gate is formed in a trench in the device such that when the gate is suitably biased a vertical channel is formed adjacent the trench.

BACKGROUND OF THE INVENTION

In trench-gate semiconductor devices, as in other semiconductor devices, the reverse bias breakdown voltage (BVdss) is an important device parameter. In a standard trenchMOS structure, a reverse bias across the device is largely supported in the epitaxial (epi) silicon region. Support of a higher reverse bias without breakdown generally requires both a thicker epi layer and a lower doped epi layer.

However, in the onstate, that is, when there is a forward bias across the device, a lower doped epi layer presents a greater resistance to current flow, as does a thicker layer. This resistance makes a significant contribution to, and may dominate, the forward bias drain-source resistance (Rdson). Rdson is equally an important parameter for the device.

Thus there are two parameters, optimisation of which is potentially conflicting: ideally the device should have a minimum Rdson in order to limit the power dissipation within the device when in the on state; however ideally a device should have a high BVdss in order to maximise the reverse bias which the device can withstand.

In general, where BVdss is governed by the breakdown of a linearly doped one-sided junction (that is, for example, a p+n-diode), it is possible to calculate a relationship between Rdson and BVdss. This relationship is known as the fundamental 1D breakdown limit and is given by $Rdson = 5.93 \times 10^{-4} \times BVdss^{2.5} \, m\Omega mm^2$ Thus, for example, a 30V technology with a typical BVdss of 35V will exhibit a 1D specific epi Rdson of $4 m\Omega mm^2$, ignoring the resistances of the substrate and channel.

To breach this 1D limit, it has become common place to use so called RESURF structures. A RESURF structure is one which results in a REduced SURface Field. RESURF structures have been implemented in various ways, including SOI (Silicon On Insulator), lateral DMOS, trench RESURF, and p-RESURF. However, RESURF structures are difficult to design and implement, and maximising performance is problematic. In particular, tight control is required of process parameters such as oxide thickness and doping tolerances. Furthermore, use of a RESURF structure requires corresponding modifications to the edge termination of the device lest the edge termination is not capable of supporting the whole of the BVdss of the active area, in which case the RESURF effect is lost and the device avalanches prematurely in the edge termination. Thus there is a need to provide a device which can approach or breach the 1D breakdown limit, without requiring the complexities of a RESURF structure.

US patent application publication US2002/0153558 discloses a device structure which does not rely on the RESURF principle. It discloses a very thin p-type region which extends beyond the gate. This region shields the gate from gate-drain capacitance but does not significantly enhance the breakdown voltage of the device.

SUMMARY OF THE INVENTION

It is an object of the present invention to provide a trench-gate semiconductor device which provides good performance without the requirement for a RESURF structure.

According to the present invention there is provide a trench-gate semiconductor comprising a semiconductor body having a major surface defining a plane, a trench extending into the semiconductor from the major surface and having sidewalls and having therein a conductive gate and a field plate, the conductive gate having a bottom level which is a first distance from the plane, the conductive gate being spaced apart from the sidewalls by a first gate oxide layer of a first thickness, the field plate being more remote from the plane than is the conductive gate, and being spaced apart from the sidewalls by a second gate oxide layer of a second thickness which is thicker than the first thickness, a first region of a first conductivity type adjacent the trench at the major surface, a second region of the first conductivity type and having a first doping level of a first dopant and spaced apart from the first region by a gap, and a channel-accommodating region of a second conductivity type therebetween filling the gap, the channel-accommodating region having a first layer which has a second doping level of a second dopant and a second layer which is more remote from the surface than the first layer and which has a third doping level of a third dopant, the first layer being adjacent the second layer adjacent the trench at a second distance from the plane which is less than the first distance, the channel-accommodating region being adjacent the second region at a third distance from the plane, wherein the channel-accommodating region is adjacent the trench across the whole of the gap, the third distance is greater than the first distance, and the third doping level is such that, in operation, when a reverse bias is applied across the trench-gate semiconductor device, at least 30% and preferably at least half of the bias is across the channel-accommodating region.

Inclusion of the second layer of the channel-accommodating region, which is typically formed of a very low doped p-type layer in the case where the first conductivity type is n-type, in combination with a deep trench, but without a shield region between the channel-accommodating region and the lower part of the trench, thus allows a high BVdss, without the penalty of significantly increased Rdson.

Preferably the field plate is electrically connected to the conductive gate. Alternatively, the field plate may be electrically connected to a source contact. Thus in these embodiments the invention is directly compatible with conventional three terminal and four terminal devices. In an alternative embodiment, the field plate may be electrically connected to a fixed bias voltage. This embodiment is particularly suited where an independent external voltage, for instance 12V, may be available to the device.

The third doping level preferably may be in the range $1E15/cm^3$ to $5E15/cm^3$, or may more preferably be less than or equal to $1E15/cm^3$. Thus the doping level of the second layer of the channel-accommodating region is sufficiently low that a significant proportion of reverse bias is dropped across this layer in use.

Advantageously the first doping level may be in the range of $5E16/cm^3$ to $5E17/cm^3$. This provides for an appropriate range of doping level required to set the threshold voltage in the upper doped portion of the structure.

Preferably the second dopant is the same as the third dopant. Moreover, preferably the first conductivity type is n-type and the second conductivity type is p-type.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which

FIGS. 8a and 8b are each plots of the variation of specific on-resistance (Rdson) with the depth of the oxide step for devices according to FIGS. 1b and 1c, respectively for different gate-source voltages.

FIGS. 9a and 9b are each plots of the variation of the switching figure of merit with the depth of the oxide step for a device according to a first embodiment and a second embodiment, respectively.

Figure 1A:
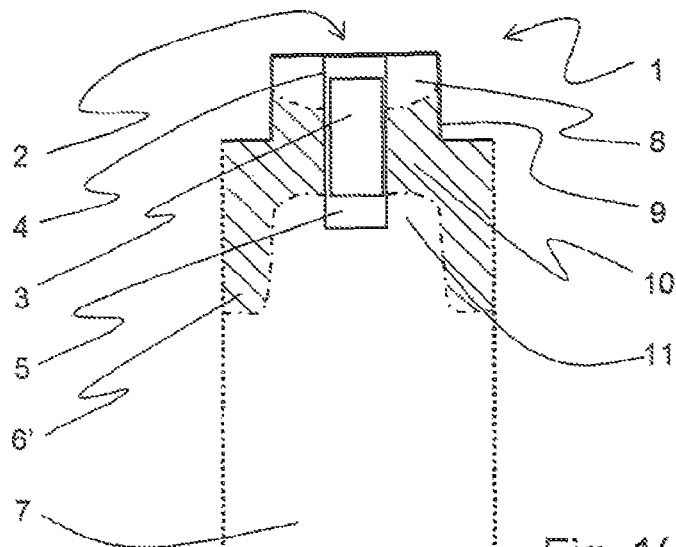
FIG. 1a is a schematic section through part of a trench-gate semiconductor device according to the prior art.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

FIG. 1a shows a schematic section through a conventional trench-gate semiconductor device 1. Extending from a major surface 2 of the device, there is a trench 4, within which is located an electrically insulated gate 3. The walls and base of the trench 4 are lined with oxide material 5. At the major surface of the device there is a source region 8 adjacent the trench. Below the trench and extending deeper into the device there is an epitaxial layer or epi region 7. The epitaxial layer 7 is of the same conductivity type as the source region 8. In a typical device these regions are of n-type conductivity. Adjacent the trench and lying between the source region 8 and the epi region 7, there is a channel-accommodating region 10. In this example the channel-accommodating region 10 is of p-type conductivity. The depth to which the channel-accommodating region extends corresponds broadly to the bottom of the gate 3 within the trench 4. Distant from the trench, the channel-accommodating region 10 is extended deeper into the device by means of a lower-doped region 6' of the same conductivity type as the channel-accommodating region (in this case, p-type). Distant from the trench 4, the surface of the device is recessed (at 9) in order to provide access to contact the channel-accommodating region 10 and the source region 8.

Figure 1B:
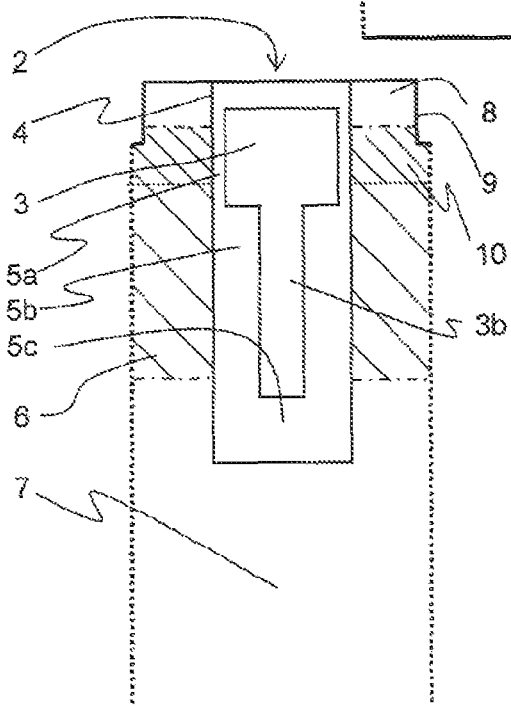
FIG. 1b and FIG. 1c are schematic sections through part of a semiconductor device according to first and second embodiments of the invention respectively.

Part of a trench-gate semiconductor device according to a first embodiment of the invention is shown in FIG. 1b. This device is generally similar to FIG. 1a, except that the trench 4 is generally wider and deeper than in the conventional device. This deeper trench 4 accommodates a stepped oxide structure. In this structure the electrically isolated gate 3 lies within an upper part of the trench 4. This electrically isolated gate 3 is separated from the walls of the trench by a thin oxide layer 5a. Deeper in the trench 4, that is to say, further from the major surface 2 of the device, the oxide is thicker than in the upper part of the trench. Thus the oxide has a "stepped" structure, there being a step in its thickness. In this embodiment the electrically isolated gate 3 extends deeper into the trench, beyond the step, to form an extended gate area 3b.

A further important difference between this embodiment and the prior art is the presence of a low doped extension 6 to the channel-accommodating region 10: in contrast to the prior art shown in FIG. 1a, this low doped layer 6 lies adjacent the deeper part of the trench 4. The low doped layer 6 extends generally to the same depth as, but slightly shallower than, the gate extension 3b.

Figure 1C:
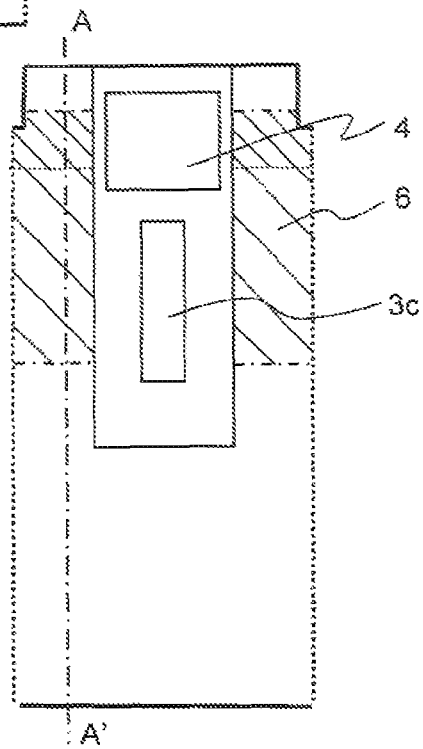

A second embodiment of the invention is shown in FIG. 1c. This embodiment is generally similar to that shown in FIG. 1b; however, in this instance the gate 3 is not electrically connected to the lower structure residing in the trench 4. Instead, the lower structure is electrically isolated from the gate, and comprises a field plate 3c. As in the previous embodiment, the low doped layer 6 extends generally similarly to, but slightly shallower than, the depth of the field plate 3c.

Thus, put briefly, the first and second embodiments shown respectively in FIGS. 1b and 1c include a low doped layer as part of the channel-accommodating region, which low doped layer lies adjacent to a deep trench. The trench includes a step oxide configuration, and the lower part of the trench may contain an extended gate, or an electrically isolated field plate.

Figure 2:
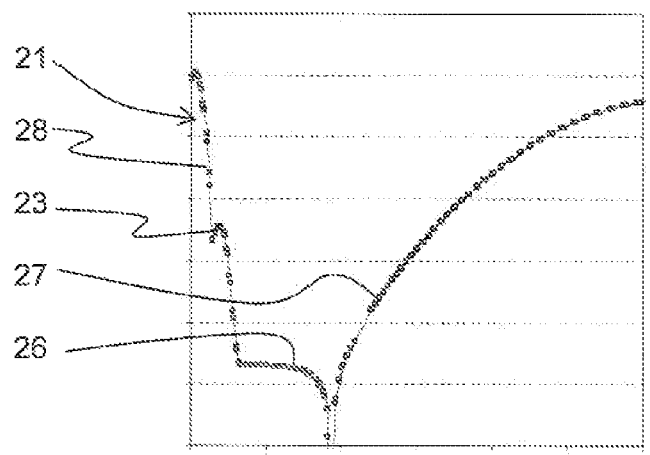
FIG. 2 illustrates the doping profile through the embodiments illustrated in FIGS. 1b and 1c.

FIG. 2 shows the doping profile through a section AA' of FIG. 1c. Adjacent the surface of the device, the doping profile 21 has a region 28 of a first conductivity type, n-type in this case. This corresponds to the doping in the source region of the device. Further or deeper into the device, the conductivity changes to a second conductivity type, to give a doping level 23 in the channel-accommodating region. The next region of the device corresponds to the low doped extension 6 to the channel-accommodating region 10. As shown at 26, the doping in this region is approximately constant. That is to say, the doping profile is neatly horizontal. Finally, region 27 of the plot shows the doping profile in the epitaxial silicon layer 7. The doping in this layer may be constant or, as shown may be linearly or exponentially graded.

Worthy of note is the fact that the doping concentration 26 of the low doped extension 6 to the channel-accommodating region may have a very low value. Typically the value of the doping concentration may be in the range of 1E15 to 5E15/$cm^3$; however a doping concentration of less than $1E15/cm^3$ is typically used in this embodiment. Such a doping level, when used in combination with a higher doping level in the epitaxial silicon, as shown in 27, can ensure that a significant proportion of a reverse bias across the device will be dropped within the low doped layer 6.

Figure 3:
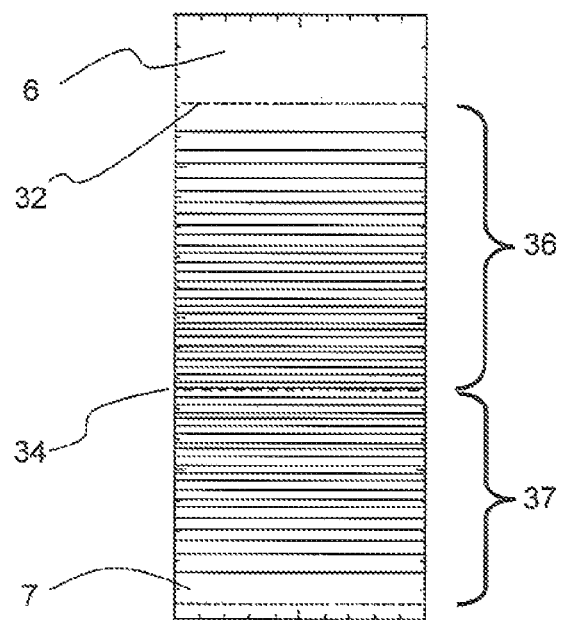
FIG. 3 illustrates the blocking capability of the structure of FIG. 2 without a trench network in place.

FIG. 3 shows the potential field distribution pattern from the doping structure of the first and second embodiments, absent the trench network. The metallurgical junction 34 between the epitaxial layer 7 and the low doped region 6, is shown together with the field distribution pattern within the depleted region which comprises region 37 within the epitaxial layer and region 36 within the low doped layer. The edge of the depletion layer is shown at 32. From this figure, it is clear that a significant proportion of the bias is dropped within the low doped layer 6. Simulations on such a structure show that a reverse breakdown voltage BVdss of up to 46V may be attainable for a nominally 35V device design. It has been found that it is preferable that at least 30%, or even at least half, of the bias is dropped within this low doped layer 6. From another aspect, it is beneficial that at least 30%, or even at least half, of the bias is dropped across the channel-accommodating region.

Figure 4:
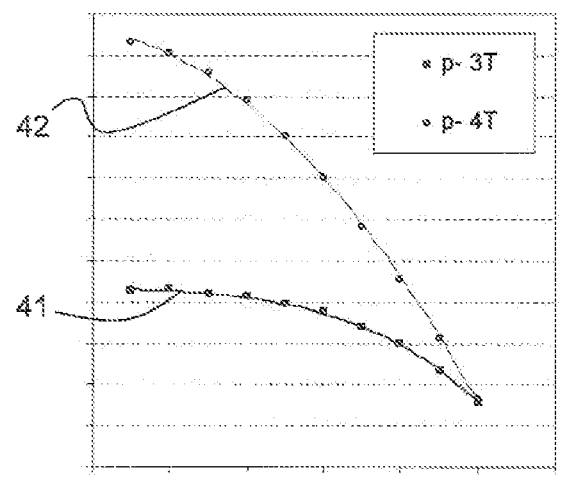
FIG. 4 is a plot showing the calculated breakdown voltages for two exemplary devices according to the first and second embodiment.

FIG. 4 shows the variation of open source reverse bias breakdown (BVdss) with the depth of the oxide step for typical devices according to the first (41) and second (42) embodiments of the invention. The Figure demonstrates that a higher reverse breakdown voltage may be achieved with a so called "four terminal" (4T) device—that is, one according to the second embodiment of the invention wherein the field plate is electrically isolated from the gate, than with the three terminal (3T) device of the first embodiment. Moreover, it is clear that the reverse breakdown characteristics are better for a device having a shallower oxide step; that is to say, where more of the depth of the trench is lined by the thicker oxide.

Figures 5A, 5B:
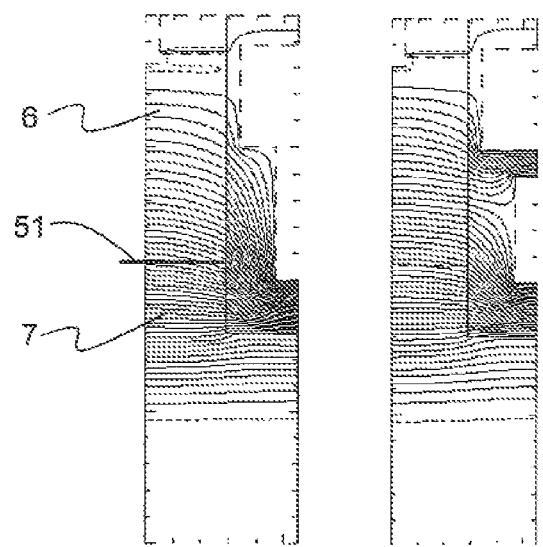
FIGS. 5a and 5b show, respectively, the field distribution patterns for the embodiments illustrated in FIGS. 1b and 1c, under reverse bias conditions.

The corresponding potential field distribution pattern for the first and second embodiments is shown respectively in FIGS. 5a and 5b. Since the field patterns are symmetrical around the centre line of the gate structure, only the left hand half of FIGS. 1a and 1b are shown. The Figures clearly show that a significant proportion of the voltage is dropped in the low doped layer 6; that is to say, above the metallurgical junction 51.

Figure 6:
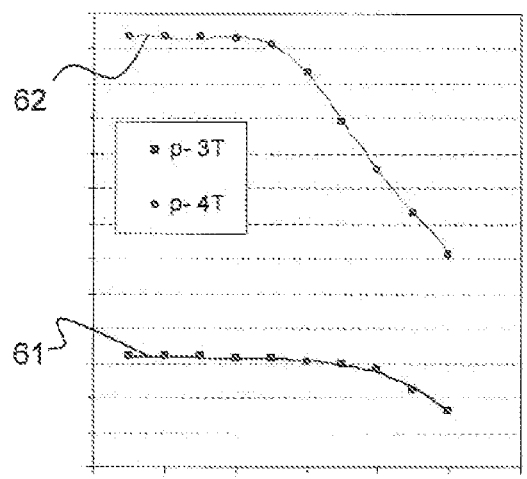
FIG. 6 is a plot of the calculated drain source breakdown voltage with open gate for the embodiments of FIGS. 1b and 1c.

FIG. 6 shows the variation of open gate reverse bias breakdown voltage with the depth of the oxide step, for example devices of the invention according to the first embodiment (plot 61) and the second embodiment (plot 62) respectively. Again, a significantly higher reverse breakdown voltage is achieved with the four terminal device. Furthermore, in these examples, a higher reverse breakdown is achieved with a shallower depth of oxide step.

Figures 7A, 7B:
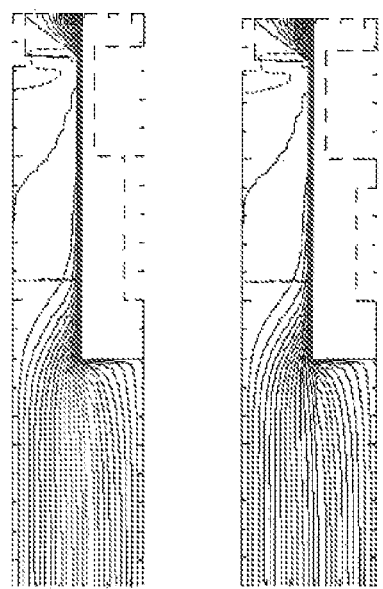
FIGS. 7a and 7b illustrate the Rdson current flow lines of the first and second embodiments respectively.

FIG. 7 illustrates Rdson current flow lines for the first and second embodiments, in FIG. 7a and FIG. 7b respectively. As oxide step increases, Rdson reduces because the channel accommodating region exhibits lower Rdson per µm than that part of the trench which accommodates the thicker oxide. The four terminal 4T device exhibits a lower Rdson relative to the 3T device due to its fixed bias, in this example of 12V, on the 4th, that is the bottom, terminal.

FIGS. 8a and 8b show the variation of the specific forward resistance or on-resistance (Rdson) with the depth of the oxide step for a device according to the first embodiment (81a and 81b) and the second embodiment (82a, 82b) respectively. FIG. 8b shows the response for a gate-source voltage which is approximately twice that of FIG. 8a. In the particular example shown in the figures, the gate-source voltages are 4.5V and 10V respectively. In each case the device according to the second embodiment (that is a 4 terminal device), shown at 82a and 82b respectively, exhibits a lower specific on-resistance. Moreover, as is to be expected by virtue of the thinner low doped (and thus high-resistance) layer, the specific on-resistance falls with increasing depth of the oxide step.

FIGS. 9a and 9b show the variation of the switching figure of merit with the depth of the oxide step for a device according to the first embodiment (91a and 91b) and the second embodiment (92a, 92b) respectively. FIG. 9b shows the response for a gate-source voltage which is approximately four times that of FIG. 9a. In the particular example shown in the figures, the gate-source voltages are 4.5V and 19V respectively. The switching figure of merit is given by Qgd*Rdson. That is, it is the product of the drain-source resistance in the on-state (Rdson), with the gate-drain charge (Qgd). In each case the device according to the second embodiment (that is, a 4 terminal device), shown at 92a and 92b respectively, exhibits a better figure of merit—that is to say, the Qgd*Rdson product is lower. For the 3T device (91a, 91b) the improvement in Rdson*Qgd is in line with the improvement with Rdson and that there is no degradation in Qgd relative to a standard TrenchMOS technology. For the 4T device the improvement in Rdson*Qgd is two-fold: firstly, there is an improved Rdson; but moreover, secondly, the fourth terminal which is permanently biased shields the gate from capacitive current thereby reducing the gate charge Qg. This ideally makes the 4T device the preferred option.

From a combination of FIGS. 4, 6 and 9, it may be derived that there is an optimum depth of the oxide step which will result in optimum performance of the device. Furthermore, the second embodiment may be concluded to be a particularly preferred embodiment since it has been shown to provide enhanced performance over the first embodiment, for the specific example device structure for which these results were determined.

The above embodiments have been described in relation to MOSFETs. However, it will be immediately apparent to the person skilled in the art that the invention is not limited to such devices, but is equally applicable to other types of IGFETs and IGBTs (that is, Insulated GateFETs and Insulated Gate Bipolar Transistors).

From reading the present disclosure, other variations and modifications will be apparent to the skilled person. Such variations and modifications may involve equivalent and other features which are already known in the art of trench-gate semiconductor devices, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A trench-gate semiconductor device comprising
a semiconductor body having a major surface defining a plane,
a trench extending into the semiconductor from the major surface and having sidewalls and having therein a conductive gate and a field plate,
the conductive gate having a bottom level which is a first distance from the plane, the conductive gate being spaced apart from the sidewalls by a first gate oxide layer of a first thickness,
the field plate being more remote from the plane than is the conductive gate, and being spaced apart from the sidewalls by a second gate oxide layer of a second thickness which is thicker than the first thickness, a first region of a first conductivity type adjacent the trench at the major surface, a second region of the first conductivity type and having a first doping level of a first dopant and spaced apart from the first region by a gap, wherein the second region comprises an epitaxial silicon layer, and wherein the doping of the epitaxial silicon layer is linearly or exponentially graded, and a channel-accommodating region of a second conductivity type therebetween filling the gap, the channel-accommodating region having a first layer which has a second doping level of a second dopant and a second layer which is more remote from the surface than the first layer and which has a third doping level of a third dopant, the first layer being adjacent the second layer adjacent the trench at a second distance from the plane which is less than the first distance, the channel-accommodating region being adjacent the second region and at a third distance that is measured from the plane to a bottom level of the second layer of the channel-accommodating region, wherein the field plate has a top level that is at a fourth distance from the plane and a bottom level that is at a fifth distance from the plane, and wherein the third distance is greater than the fourth distance but less than the fifth distance, wherein the channel-accommodating region is adjacent the trench across the whole of the gap, the third distance is greater than the first distance, and the third doping level is such that, in operation, when a reverse bias is applied across the trench-gate semiconductor device, at least 30% of the bias is across the channel accommodating region.

2. A trench-gate semiconductor device according to claim 1, wherein, when a reverse bias is applied across the trench-gate semiconductor device, at least half the bias is across the channel-accommodating region.

3. A trench-gate semiconductor device according to claim 1, wherein the field plate is electrically connected to the conductive gate.

4. A trench-gate semiconductor device according to claim 1, wherein the field plate is electrically connected to a source contact.

5. A trench-gate semiconductor device according to claim 1, wherein the field plate is electrically connected to a fixed bias voltage.

6. A trench-gate semiconductor device according to claim 1, wherein the third doping level is in the range $1E15/cm^3$ to $5E15/cm^3$.

7. A trench-gate semiconductor device according to claim 1, wherein the third doping level is less than or equal to $1E15/cm^3$.

8. A trench-gate semiconductor device according to claim 1, wherein the first doping level is in the range $5E16/cm^3$ to $5E17/cm^3$.

9. A trench-gate semiconductor device according to claim 1, wherein the second dopant is the same as the third dopant.

10. A trench-gate semiconductor device according to claim 1, wherein the first conductivity type is n-type and the second conductivity type is p-type.

11. A trench-gate semiconductor device according to claim 1, wherein the second region is the epitaxial silicon layer.

* * * * *